(12) United States Patent
Lee

(10) Patent No.: US 7,408,830 B2
(45) Date of Patent: Aug. 5, 2008

(54) DYNAMIC POWER SUPPLIES FOR SEMICONDUCTOR DEVICES

(75) Inventor: Cheng-Hung Lee, Hsinchu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 0 days.

(21) Appl. No.: 11/593,778

(22) Filed: Nov. 7, 2006

(65) Prior Publication Data

US 2008/0122525 A1   May 29, 2008

(51) Int. Cl.
*G11C 5/14* (2006.01)
(52) U.S. Cl. .......... 365/226; 365/227; 365/228; 365/189.09
(58) Field of Classification Search .......... 365/226, 365/227, 228, 189.09
See application file for complete search history.

(56) References Cited

U.S. PATENT DOCUMENTS

| | | | | |
|---|---|---|---|---|
| 5,276,645 A | * | 1/1994 | Tanaka et al. | 365/189.07 |
| 5,303,190 A | * | 4/1994 | Pelley, III | 365/189.11 |
| 5,376,837 A | * | 12/1994 | Nakano | 327/530 |
| 5,404,329 A | * | 4/1995 | Yamagata et al. | 365/189.09 |
| 5,541,529 A | * | 7/1996 | Mashiko et al. | 326/39 |
| 5,774,405 A | * | 6/1998 | Tomishima | 365/226 |
| 6,038,183 A | * | 3/2000 | Tsukude | 365/201 |
| 6,107,869 A | * | 8/2000 | Horiguchi et al. | 327/544 |
| 6,380,798 B1 | * | 4/2002 | Mizuno et al. | 327/534 |
| 6,434,076 B1 | * | 8/2002 | Andersen et al. | 365/222 |
| 6,455,901 B2 | * | 9/2002 | Kameyama et al. | 257/371 |
| 6,642,757 B2 | | 11/2003 | Ikehashi et al. | 327/143 |
| 6,901,012 B2 | | 5/2005 | Ikehashi et al. | 365/189.11 |
| 7,020,041 B2 | | 3/2006 | Somasekhar et al. | 365/229 |
| 7,042,245 B2 | * | 5/2006 | Hidaka | 326/34 |

OTHER PUBLICATIONS

Masanao Yamaoka et al., "Low-power Embedded SRAM Modules with Expanded Margins for Writing.", p. 480, ISSCC 2005.
K. Zhang et al., "A 3-GHz 70Mb SRAM in 65nm CMOS Technology with Integrated Column-Based Dynamic Poer Supply", p. 474, ISSCC 2005.

* cited by examiner

*Primary Examiner*—Viet Q Nguyen
(74) *Attorney, Agent, or Firm*—K & L Gates LLP

(57) ABSTRACT

This invention discloses a power supply management circuit which comprises at least one switching circuit coupled between a power supply and a power recipient circuit, and at least one voltage booster circuit coupled between a control circuit and the power recipient circuit, wherein the control circuit is configured to turn on-or-off the switching circuit, and to activate or de-activate the voltage booster circuit.

8 Claims, 4 Drawing Sheets

DYNAMIC POWER SUPPLIES FOR SEMICONDUCTOR DEVICES

BACKGROUND

The present invention relates generally to integrated circuit (IC) design, and, more particularly, to power supply management for IC memory devices.

A need for low power electronics has been driven by portable applications, packing density of ICs and conservation of energy. Reducing power supply voltage is an effective way to reduce power consumption of an IC. On the other hand, ever scaling down in semiconductor device sizes demands low supply voltage operations. But small device sizes and low supply voltage cause high leakage and instability in device operations. Cell operation of a static random access memory (SRAM) is one example. FIG. 1 shows a column 100 of SRAM cells 102[0:n], where n is an integer. The SRAM cell 102[0] shown in FIG. 1 has six transistors. Two P-type metal-oxide-semiconductor (PMOS) transistors 110 and 120, and two N-type metal-oxide-semiconductor (NMOS) transistor 115 and 125 form two cross-coupled inverters to store a state in either node C or node D. Two NMOS transistor 130 and 135 serve as pass-gates between a pair of complementary bit-lines (BLs) 140 and 145, and node C and D, respectively. The gates of both the NMOS transistors 130 and 135 are coupled to a word-line (WL) 150. A high voltage power supply (Vcc) line 160 is coupled to the sources of the PMOS transistors 110 and 120 of every cell 102 in the column 100, while a low voltage power supply (Vss) line 170 is coupled to the sources of the NMOS transistors 115 and 125 of the cells 102[0:n]. When writing to the cell 102[0], the complementary BLs 140 and 145 are forced a voltage to overwrite a previous state stored in nodes C or D, therefore, lower Vcc will make the writing easier. When reading from the cell 102[0], the BLs 140 and 145 become driven by nodes C and D, apparently, higher Vcc will make the reading easier. Writing and reading put contradictory demands on the Vcc. As the Vcc scales down with the device sizes, and process variations increase in proportion to the device sizes, it is increasingly difficult for a fixed power supply voltage to meet these contradictory demands.

As such, what is needed is a dynamic power supply that can increase or decrease it voltage on demands.

SUMMARY

This invention discloses a power supply management circuit. According the one embodiment of the present invention, the power supply management circuit comprises at least one switching circuit coupled between a power supply and a power recipient circuit, and at least one voltage booster circuit coupled between a control circuit and the power recipient circuit, wherein the control circuit is configured to turn on-or-off the switching circuit, and to activate or de-activate the voltage booster circuit.

According to another embodiment of the present invention, the power supply management circuit comprises at least one PMOS transistor with a source, a drain, a gate and a bulk coupled to a power supply, a power recipient circuit, a control circuit and the power recipient circuit, respectively, wherein the control circuit is configured to turn on-or-off the power supply to the power recipient circuit through switching the PMOS transistor.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses various dynamic power supplies for semiconductor devices.

Figure 1:
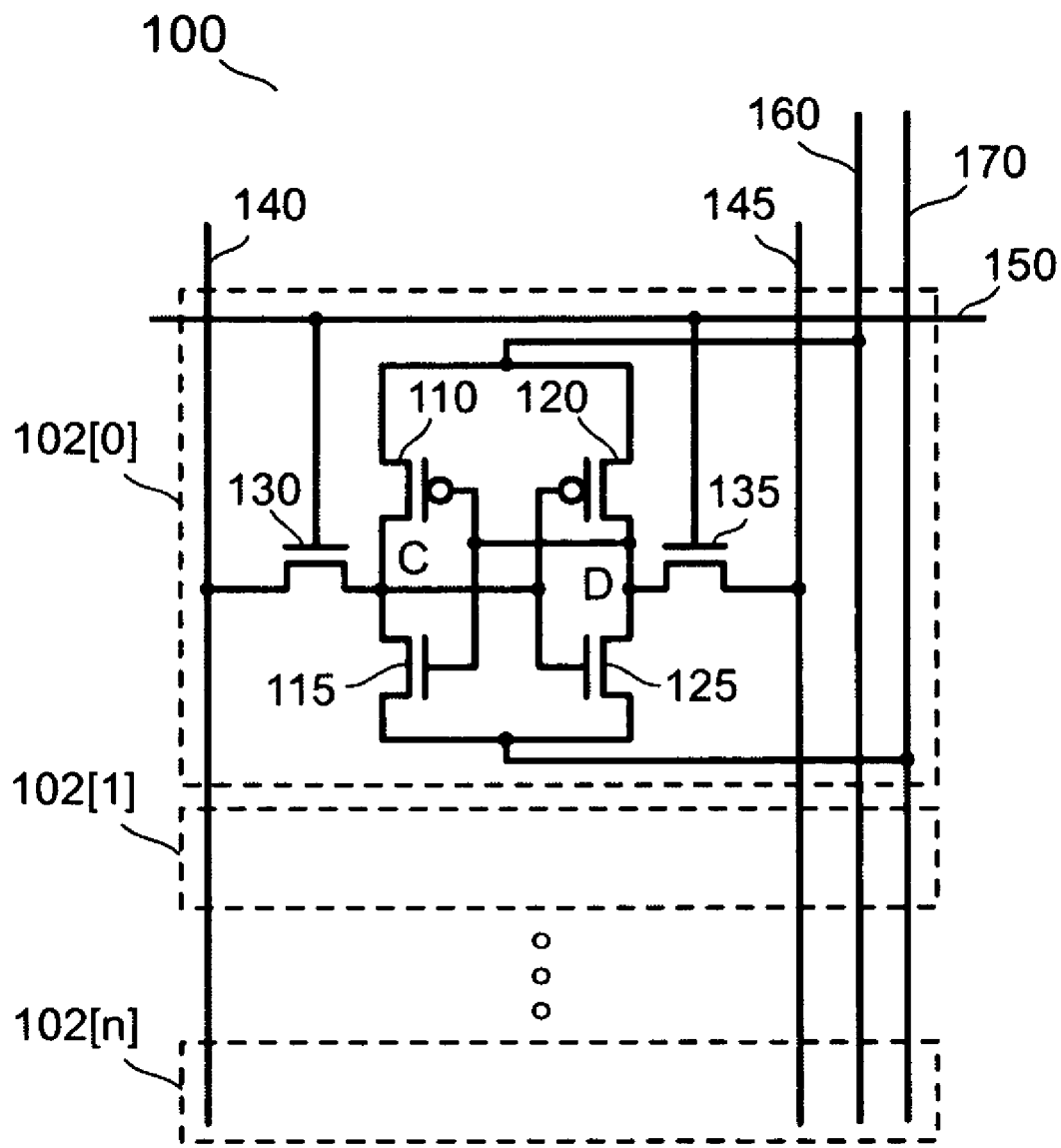
FIG. 1 is a schematic diagram illustrating a column of conventional 6-T SRAM cells.

FIG. 1 has already been described and discussed as the relevant background to the present invention. It requires no further discussion here.

Figure 2A:
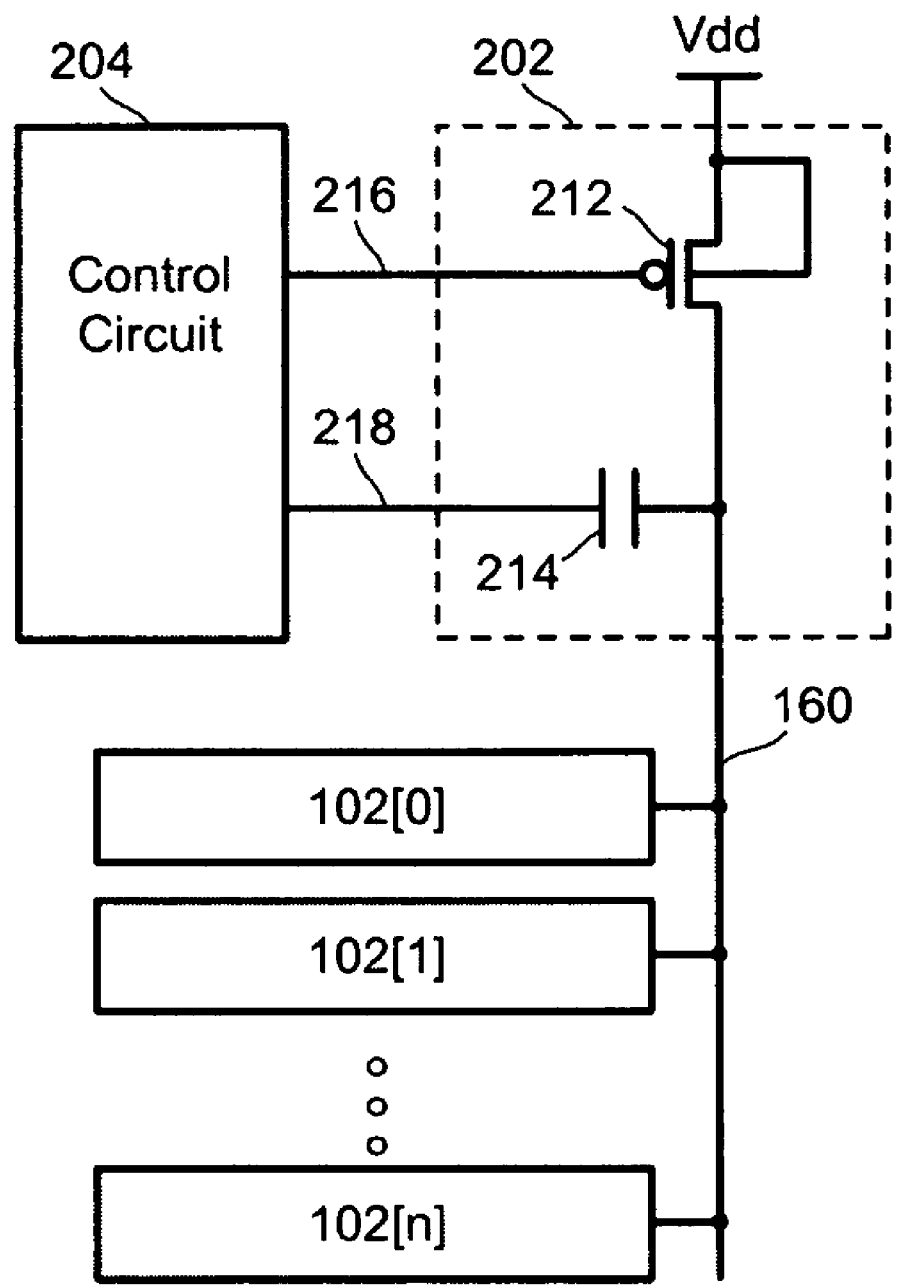
FIGS. 2A~2C are schematic diagrams illustrating three dynamic power supplies according to embodiments of the present invention.
Figure 2B:
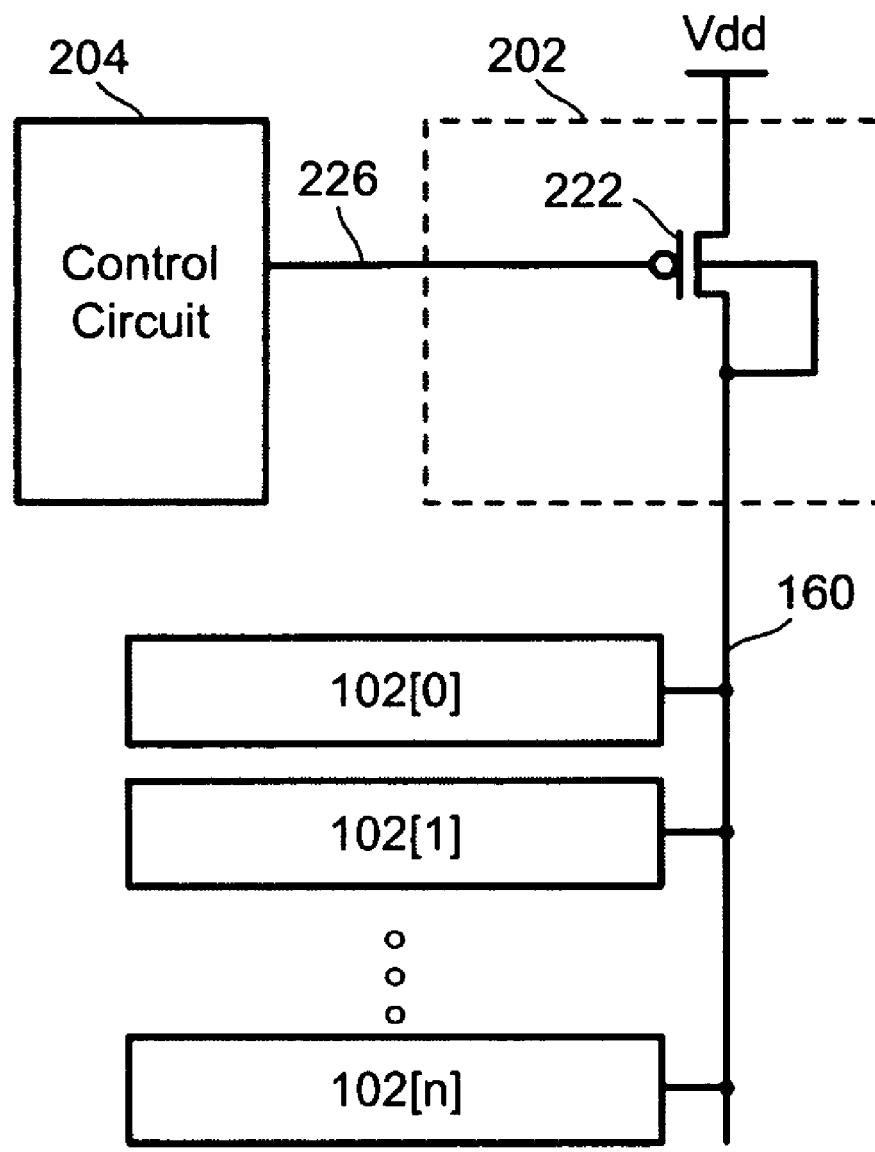
Figure 2C:
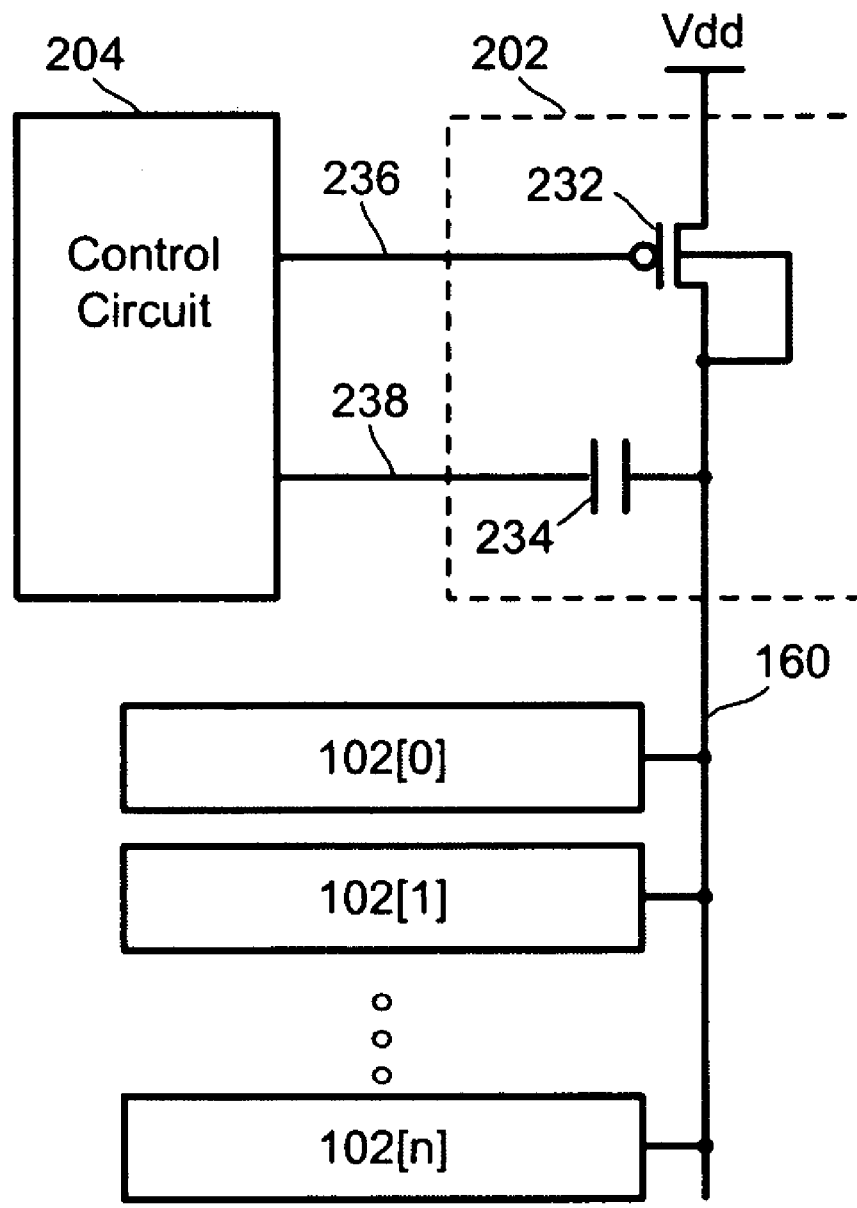

FIGS. 2A~2C are schematic diagrams illustrating three dynamic power supplies according to embodiments of the present invention. Memory cells 102[0:n] illustrated here are 6-T SRAM cells shown in FIG. 1. Between a system high voltage power supply (Vdd) and a cells' high voltage power supply Vcc line 106, a block 202 is coupled.

Referring to FIG. 2A, in a first embodiment of the present invention, the block 202 may be implemented as a PMOS transistor 212 and a capacitor 214. A drain, a source, a gate and a bulk of the PMOS transistor 212 are coupled to the Vdd, the Vcc line 160, the block 204 at a node 216 and the Vdd, respectively. The capacitor 214 is coupled between the Vcc line 160 and the block 204 at node 218. During non-access or standby periods, node 216 is in a logic LOW state, and the PMOS transistor 212 is on, so that the Vcc is approximately equal to the Vdd. During writing the SRAM cell 102 periods, node 216 is temporarily turned to a HIGH logic state, which then shut off the PMOS transistor 212, so that the Vcc line 160 becomes floating during the short writing period. Charges previously stored in the Vcc line 160 embark on a discharging process, therefore, the voltages at the floating Vcc line 160 will begin to drop, which is a favorable condition for writing. Additionally, prior to the writing period, node 218 is kept at the Vdd, hence no charge is stored in the capacitor 214. Once entering the writing period, node 218 is temporarily turned to a voltage lower than the Vdd, such as Vss, which will force the voltage at the Vcc line 160 to drop even faster than a case where only the PMOS transistor 212 alone is employed.

During reading the SRAM cell 102 periods, node 216 remains at the logic LOW state, which turns on the PMOS transistor 212, therefore, the Vdd supplies the Vcc line 160. But prior to the actual reading, node 218 is kept at a voltage lower than the Vdd, so that the capacitor 214 is charged. Upon a start of the reading, node 218 is switched from the low voltage to the Vdd, so that the capacitor 214 provides a voltage boost to the Vcc line 160. As discussed earlier, higher Vcc voltage is favorable to reading the SRAM cell 120.

Referring to FIG. 2B, in a second embodiment of the present invention, the block 202 may be implemented as just a PMOS transistor 222 with a source, a drain, a gate and a bulk coupled to the Vdd, the Vcc line 160, to a block 204 at node 226 and the Vcc line 160, respectively. Similar to the first embodiment, the PMOS transistor 222 is turned on during reading the SRAM cell 102, and turned off during writing the SRAM cell 102 by the block 204. When the PMOS transistor 222 is on, the Vcc line 160 is driven by the Vdd, which is a favorable condition for reading. When the PMOS transistor 222 is off, the Vcc line 160 is floating, which is a favorable condition for writing. Beside the second embodiment does not employ a boost capacitor 214 as shown in FIG. 2A, the second embodiment differs from the first embodiment in that the bulk of the PMOS transistor 222 is coupled to the Vcc line 160, or the drain of itself. As a result, when the PMOS transistor 222 is on, there is a voltage drop across its source and drain. The magnitude of the voltage drop equals approximately its threshold voltage. This lowered Vcc voltage condition is desirable for lowering standby leakage of the SRAM cells 102.

Referring to FIG. 2C, in a third embodiment of the present invention, the block 202 may be implemented as a PMOS transistor 232 and a capacitor 234. A source, a drain, a gate and a bulk of the PMOS transistor 232 are coupled to the Vdd, the Vcc line 160, to a block 204 at node 236 and the Vcc line 160, respectively. Apparently, the connection of the PMOS transistor 232 is the same as the PMOS transistor 222 in the second embodiment. According the third embodiment, the PMOS transistor 232 also functions the same as the PMOS transistor 222, i.e., the PMOS transistor 232 is turned on during reading the SRAM cell 102, and turned off during writing the SRAM cell 102 by the block 204. When the PMOS transistor 232 is on, the Vcc line 160 is driven by the Vdd, which is a favorable condition for reading. When the PMOS transistor 232 is off, the Vcc line 160 is floating, which is a favorable condition for writing. Since the bulk of the PMOS transistor 232 is coupled to the Vcc line 160, or the drain of itself. As a result, when the PMOS transistor 232 is on, there is a voltage drop across its source and drain. The magnitude of the voltage drop equals approximately its threshold voltage. This lowered Vcc voltage condition is desirable for lowering standby leakage of the SRAM cells 102.

Then there is the boost capacitor 234, which is connected the same as the capacitor 214 in the first embodiment. According to the third embodiment, the capacitor 234 also functions the same as the capacitor 214, i.e., during writing the capacitor 234 helps pulling down the voltage at the floated Vcc line 160, and during reading, the charge previously stored in the capacitor 234 provides a boost to the voltage at the Vcc line 160, which is driven by the Vdd in reading case.

Referring the FIGS. 2A~2C, the blocks 204 are not provided with any detailed implementations, as one skilled in the art would have no difficulty to construct circuits to provide signals at the corresponding nodes 216, 218, 226, 236 and 238 for these blocks. The functions of these signals are described in above paragraphs. Typically the blocks 204 may contain inverters, NOR and NAND gates, etc.

The capacitor, 214 or 234, may be formed by any appropriately available semiconductor materials in a die for a given process, such as metal-intermetal dielectric-metal (MiM), metal-oxide-semiconductor (MOS) or polysilicon-interpoly dielectric-polysilicon (PiP).

With this PMOS transistor switching and capacitor voltage boosting capacities, the power supply to the SRAM cells may be dynamically managed to mean the contradictory demands of the reading and writing operations.

Although the embodiments show only the SRAM cell as a recipient of the dynamic power supplies, and only the Vdd is switched according to the present invention, one having skill in the art would appreciate that the present invention may be applied to other memories or even logic circuits where contradictory voltage conditions are desired in different operations, and the Vss power supply can be similarly switched.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A power supply management circuit comprising:
   at least one switching circuit coupled between a power supply voltage and a power recipient circuit; and
   at least one voltage booster circuit coupled between a control circuit and the power recipient circuit,
   wherein the control circuit is configured to turn on-or-off the switching circuit, and to activate or de-activate the voltage booster circuit, such that the power management circuit generates a first voltage higher than the power supply voltage during reading periods and a second voltage lower than the power supply voltage during writing periods for the power recipient circuit.

2. The power supply management circuit of claim 1, wherein the switching circuit comprises at least one P-type metal-oxide-semiconductor (PMOS) transistor with a source, a drain, a gate and a bulk coupled to the power supply voltage, the power recipient circuit, the control circuit and the power supply voltage, respectively.

3. The power supply management circuit of claim 1, wherein the switching circuit comprises at least one PMOS transistor with a source, a drain, a gate and a bulk coupled to the power supply voltage, the power recipient circuit, the control circuit and the power recipient circuit, respectively.

4. The power supply management circuit of claim 1, wherein the voltage booster circuit comprises at least one capacitor with a first and second terminal coupled to the power recipient circuit and the control circuit, respectively.

5. The power supply management circuit of claim 4, wherein the capacitor is formed by metal-intermetal dielectric-metal (MiM), metal-oxide-semiconductor (MOS) or polysilicon-interpoly dielectric-polysilicon (PiP).

6. The power supply management circuit of claim 4, wherein the second terminal is coupled to a transistor source or drain of the control circuit.

7. The power management circuit of claim 1, wherein the power recipient circuit is a plurality of static random access memory (SRAM) cells.

8. The power supply management circuit of claim 7, wherein the voltage booster circuit is a capacitor with a first and second terminal coupled to the power recipient circuit and the control circuit, respectively, and wherein the capacitor has a capacitance value that is 10% to 40% of that of a bit-line in the plurality of the SRAM cells.

* * * * *